United States Patent
Budiarto et al.

(10) Patent No.: US 10,522,375 B2
(45) Date of Patent: Dec. 31, 2019

(54) MONITORING SYSTEM FOR DEPOSITION AND METHOD OF OPERATION THEREOF

(71) Applicant: Applied Materials, Inc., Santa Clara, CA (US)

(72) Inventors: Edward W. Budiarto, Fremont, CA (US); Majeed A. Foad, Sunnyvale, CA (US); Ralf Hofmann, Soquel, CA (US); Thomas Nowak, Cupertino, CA (US); Todd Egan, Fremont, CA (US); Mehdi Vaez-Iravani, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/840,215

(22) Filed: Dec. 13, 2017

(65) Prior Publication Data

US 2018/0114711 A1    Apr. 26, 2018

Related U.S. Application Data

(62) Division of application No. 14/839,656, filed on Aug. 28, 2015, now Pat. No. 9,870,935.
(Continued)

(51) Int. Cl.
*H01L 21/00* (2006.01)
*H01L 21/67* (2006.01)
(Continued)

(52) U.S. Cl.
CPC .......... *H01L 21/67253* (2013.01); *G03F 1/22* (2013.01); *G03F 1/24* (2013.01);
(Continued)

(58) Field of Classification Search
CPC ........... H01L 21/02631; H01L 21/0332; H01L 21/0337; H01L 21/2855; H01L 21/67253;
(Continued)

(56) References Cited

U.S. PATENT DOCUMENTS

| | | |
|---|---|---|
| 5,871,805 A | 2/1999 | Lemelson |
| 6,160,621 A | 12/2000 | Perry et al. |

(Continued)

FOREIGN PATENT DOCUMENTS

| | | | |
|---|---|---|---|
| CN | 101398393 A1 | 4/2009 | |
| CN | 101726499 A | 6/2010 | |

(Continued)

OTHER PUBLICATIONS

Final Office Action in U.S. Appl. No. 15/107,062 dated Feb. 8, 2019, 22 pages.

(Continued)

*Primary Examiner* — Brook Kebede
(74) *Attorney, Agent, or Firm* — Servilla Whitney LLC

(57) ABSTRACT

A monitoring and deposition control system and method of operation thereof including: a deposition chamber for depositing a material layer on a substrate; a sensor array for monitoring deposition of the material layer for changes in a layer thickness of the material layer during deposition; and a processing unit for adjusting deposition parameters based on the changes in the layer thickness during deposition.

12 Claims, 5 Drawing Sheets

Related U.S. Application Data

(60) Provisional application No. 62/094,270, filed on Dec. 19, 2014.

(51) Int. Cl.
  *H01L 21/02*  (2006.01)
  *H01L 21/033* (2006.01)
  *H01L 21/285* (2006.01)
  *H01L 21/66*  (2006.01)
  *G03F 1/22*   (2012.01)
  *G03F 1/24*   (2012.01)

(52) U.S. Cl.
  CPC .... *H01L 21/02631* (2013.01); *H01L 21/0332* (2013.01); *H01L 21/0337* (2013.01); *H01L 21/2855* (2013.01); *H01L 22/12* (2013.01); *H01L 22/26* (2013.01)

(58) Field of Classification Search
  CPC . H01L 22/12; H01L 22/26; G03F 1/22; G03F 1/24
  USPC .............................. 438/7, 762, 763
  See application file for complete search history.

(56) References Cited

U.S. PATENT DOCUMENTS

| | | | |
|---|---|---|---|
| 6,762,849 B1* | 7/2004 | Rulkens | G01B 11/0625 356/503 |
| 6,847,463 B2 | 1/2005 | Malinowski | |
| 7,326,502 B2 | 2/2008 | Silverman | |
| 2002/0142493 A1 | 10/2002 | Halliyal et al. | |
| 2002/0150398 A1 | 10/2002 | Choi et al. | |
| 2004/0061850 A1 | 4/2004 | Fisch et al. | |
| 2004/0203177 A1 | 10/2004 | Davis et al. | |
| 2005/0018183 A1* | 1/2005 | Shortt | G01B 11/0633 356/239.1 |
| 2005/0095730 A1 | 5/2005 | Mikami | |
| 2005/0172894 A1 | 8/2005 | Farnworth | |
| 2005/0244570 A1 | 11/2005 | Tanase et al. | |
| 2005/0268847 A1 | 12/2005 | Farnworth | |
| 2006/0181706 A1 | 8/2006 | Sweeney | |
| 2007/0238204 A1 | 10/2007 | Kurihara et al. | |
| 2007/0281075 A1 | 12/2007 | Huang | |
| 2010/0091272 A1 | 4/2010 | Asada et al. | |
| 2010/0151599 A1 | 6/2010 | Bai et al. | |
| 2011/0001952 A1 | 1/2011 | Underwood et al. | |
| 2011/0052793 A1 | 3/2011 | Southwell | |
| 2011/0171758 A1 | 7/2011 | Su et al. | |
| 2011/0276166 A1 | 11/2011 | Atanasoff | |
| 2012/0084056 A1* | 4/2012 | Bucher | G01B 11/0608 702/172 |
| 2012/0135340 A1 | 5/2012 | Oh | |
| 2012/0283865 A1 | 11/2012 | Bailey, III | |
| 2013/0157388 A1 | 6/2013 | Grimbergen | |
| 2013/0313744 A1 | 11/2013 | Maruyama | |
| 2014/0007809 A1 | 1/2014 | Stolt | |
| 2014/0014917 A1 | 1/2014 | Lee et al. | |
| 2014/0174349 A1 | 6/2014 | Britt et al. | |

FOREIGN PATENT DOCUMENTS

| | | |
|---|---|---|
| EP | 1079415 A1 | 2/2001 |
| EP | 2389459 | 7/2010 |
| JP | 2005281858 A | 10/2005 |
| JP | 2011238958 A1 | 11/2011 |
| JP | 2014170931 A | 9/2014 |
| KR | 10-2007-0015538 A | 2/2007 |
| TW | 485447 A | 5/2002 |
| TW | I278924 B | 4/2007 |
| TW | 201418510 A | 5/2014 |

OTHER PUBLICATIONS

Partial Supplementary European Search Report in EP 15870910.5 dated Jul. 13, 2018, 10 pages.
PCT International Preliminary Report on Patentability in PCT/US2014/071684 dated Jun. 28, 2016, 8 pages.
PCT International Search Report and Written Opinion in PCT/US2014/071684 dated Mar. 31, 2015, 10 pages.
PCT International Preliminary Report on Patentability in PCT/US2015/065897 dated Jun. 29, 2017, 9 pages.
PCT International Search Report and Written Opinion in PCT/US2015/065897 dated Apr. 5, 2016, 10 pages.
Machine Translation of JP 2014170931, 43 pages.

* cited by examiner

MONITORING SYSTEM FOR DEPOSITION AND METHOD OF OPERATION THEREOF

CROSS-REFERENCE TO RELATED APPLICATION(S)

This application is a divisional of U.S. patent application Ser. No. 14/839,656, filed on Aug. 28, 2015, which claims the benefit of U.S. Provisional Patent Application Ser. No. 62/094,270 filed Dec. 19, 2014, to each of which priority is claimed and each of which are incorporated herein by reference in their entireties.

TECHNICAL FIELD

The present invention relates generally to a monitoring and control system, and more particularly to a monitoring and process control system for use in deposition systems including systems for manufacturing extreme ultraviolet lithography mask blanks.

BACKGROUND

Extreme ultraviolet lithography (EUVL, also known as soft x-ray projection lithography, and also abbreviated as EUV) is a contender to replace deep ultraviolet lithography for the manufacture of 14 nm, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within an extremely narrow ultraviolet bandpass; e.g., 12 to 14 nanometer bandpass for 13 nanometer ultraviolet light.

There are various classes of defects in semiconductor processing technology which cause problems in masks. For example, opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. Further, the thickness and uniformity of multilayer coatings require manufacturing precision to not distort the image produced by the final mask.

In the past, mask blanks for deep ultraviolet lithography have generally been made of glass but silicon or ultra-low thermal expansion materials have been proposed as alternatives for extreme ultraviolet lithography. Whether the blank is of glass, ultra-low thermal expansion material, or silicon, the surface of the mask blank is made as smooth as possible by mechanical polishing with an abrasive. Another obstacle in mask blank creation includes scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography, the pattern masks used must be reflective masks instead of the transmissive masks used in current lithography. The reflective mask is made up of a precise stack of alternating thin layers of molybdenum and silicon, which creates a Bragg reflector or mirror. Because of the nature of the multilayer stack and the small feature size, any imperfections in the uniformity of the layers or the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack. Further, the thickness and uniformity of the deposited layers must meet very demanding specifications to not ruin the final completed mask.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present invention provides a method of operation for a monitoring and deposition control system including: depositing a material layer on a substrate; monitoring deposition of the material layer for changes in a layer thickness of the material layer during deposition; and adjusting deposition parameters based on the changes in the layer thickness of the material layer during deposition.

The present invention provides a monitoring and deposition control system including: a deposition chamber for depositing a material layer on a substrate; a sensor array for monitoring deposition of the material layer for changes in a layer thickness of the material layer during deposition; and a processing unit for adjusting deposition parameters based on the changes in the layer thickness during deposition.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
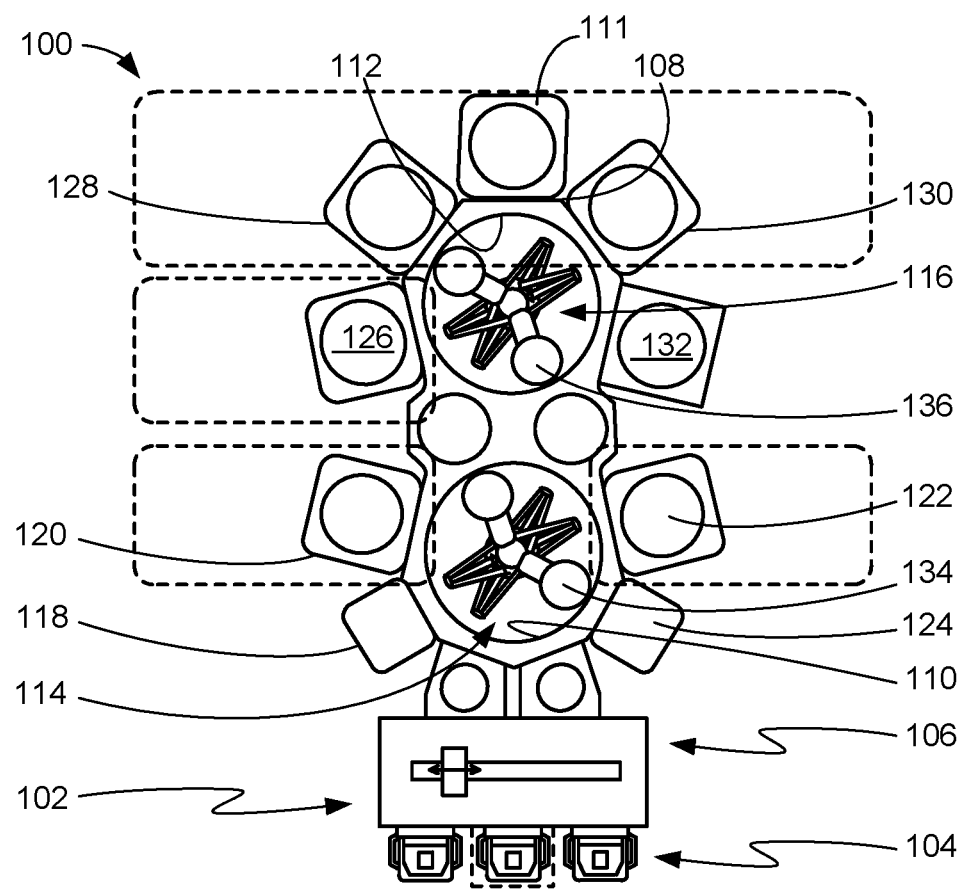
FIG. 1 is an integrated extreme ultraviolet mask production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known components and circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank or substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Embodiments of the present invention include a system and method for precise deposition control and metrology of ultra-thin layers of silicon and molybdenum, used to generate reflective mask blanks for EUV lithography.

It is a goal of the embodiments of the present invention to introduce a solution to the problem of controlling the deposition of the Mo/Si stack for EUV mask blanks. The embodiments of the present invention include a method of in-situ broadband reflectometry, in which the sample-altered reflectance spectrum of an illumination source is constantly monitored, which, in conjunction with theoretical models, furbishes information about the thickness, and deposition rate of the layers. This resulting thickness and deposition rate information can also be fed back to the process tool to improve control of the deposition processes and optimize performance of the mask blank.

Spectroscopic reflectometry systems work on the principle of the modulation of the intensity of light at a particular wavelength due to the interaction of light with a sample. The deterministic factor in such a system is often the shift in the phase of the light as it propagates within a dielectric. In the case of the Mo/Si stack, however, the materials are both highly attenuating, at least for part of the DUV-NIR region of the spectrum. What this means in practice is that the reflectance of the stack is altered by even the most minute levels of the films deposited, which is a key factor in the high sensitivity of the monitoring system.

Referring now to FIG. 1, therein is shown an integrated extreme ultraviolet mask production system 100. The integrated EUV mask production system 100 includes a substrate loading and carrier handling system 102 into which a substrate 104 or substrates are loaded. An airlock 106 provides access to a wafer handling vacuum chamber 108. In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 has a plurality of ports around its periphery for attachment of various other systems. The first vacuum chamber 110 has a degas system 118, a first physical vapor deposition system 120, a second physical vapor deposition system 122, an inspection chamber 111, and a preclean system 124. After deposition of the substrate 104, the substrate 104 can be transferred to the inspection chamber 111 for detection of defects and errors.

The second vacuum chamber 112 has a first multi-cathode source 126, a flowable chemical vapor deposition (FCVD) system 128, a cure system 130, and a second multi-cathode source 132 connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a wafer 136, around the second vacuum chamber 112 while maintaining the wafers in a continuous vacuum. It has been discovered that the integrated EUV mask production system 100 provides the ideal environment for manufacturing EUV masks.

Figure 2:
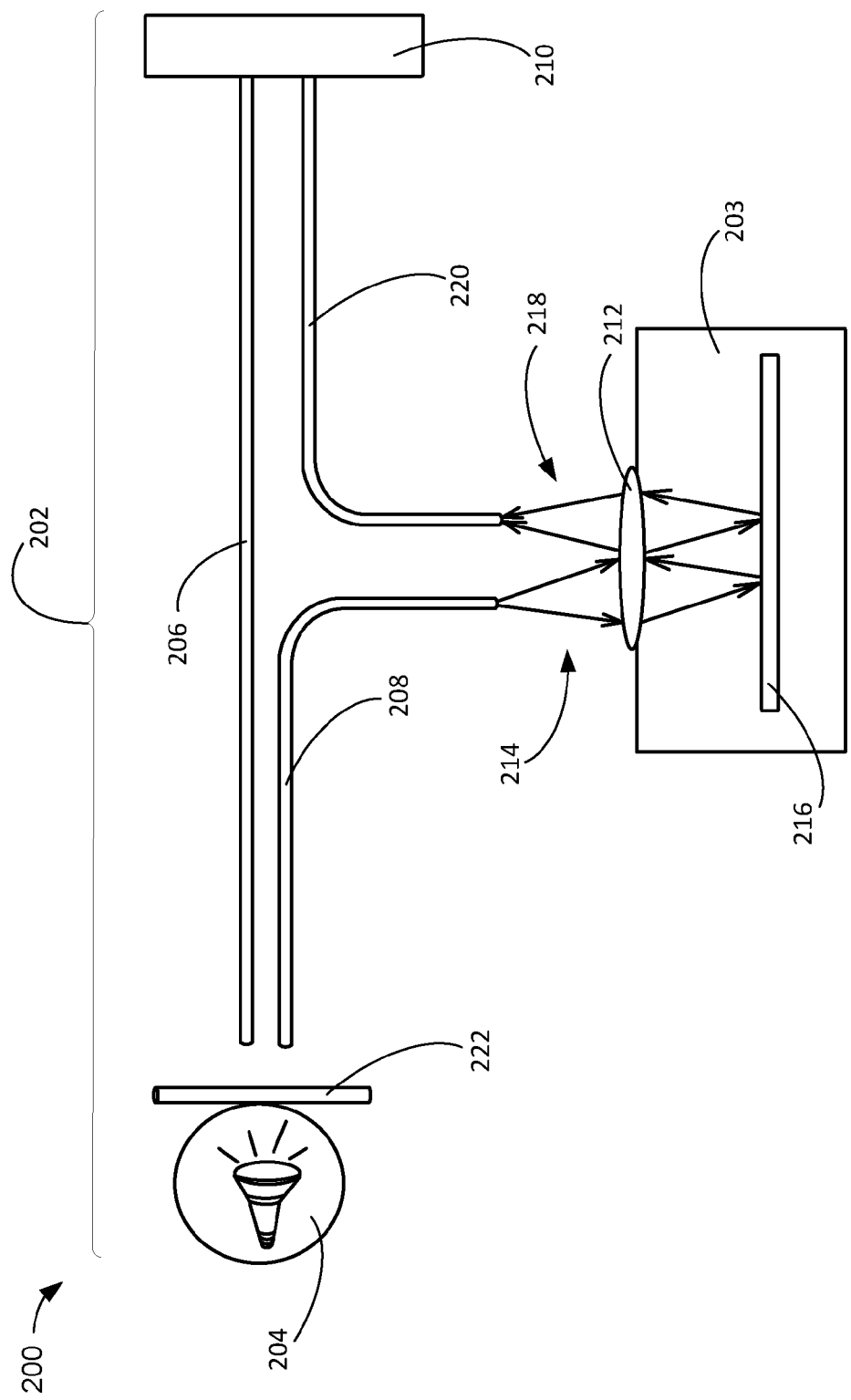
FIG. 2 is a system diagram of a monitoring and deposition control system in an embodiment of the present invention.

Referring now to FIG. 2, therein is shown a system diagram of a monitoring and deposition control system 200 in an embodiment of the present invention. The monitoring and deposition control system 200 can be used in conjunction with the first physical vapor deposition system 120, the second physical vapor deposition system 122, or the flowable chemical vapor deposition system 128, for example. The monitoring and deposition control system 200 can be used for in-situ metrology and control of deposition of multiple layers including molybdenum (Mo) and silicon (Si) on EUVL or EUV blanks, for example. For clarity, the words blank and mask blank are considered to be equivalent. The monitoring and deposition control system 200 can also be used for detecting layer thickness defects, out of spec uniformity, and defects on surfaces, such as on the surface of the substrate and of each deposited layer.

For example, the monitoring and deposition control system 200 can be implemented by incorporating a multi-spectral reflectometry system 202 into the overall design of a deposition chamber 203 such as the first physical vapor deposition system 120 of FIG. 1, the second physical vapor deposition system 122 of FIG. 1, or the flowable chemical vapor deposition system 128 of FIG. 1, for example. It has been found that incorporating reflectometry systems, such as the multi-spectral reflectometry system 202, enable in-situ monitoring and control of the Mo/Si multilayer stack during creation of an EUVL or EUV mask. In this embodiment, the multi-spectral reflectometry system 202 is fiber-coupled, but it is understood that other embodiments are possible where optical fibers are not used. For illustrative clarity, the multi-spectral reflectometry system 202 is shown mostly outside the deposition chamber 203, but it is understood that the multi-spectral reflectometry system 202 could be entirely within the deposition chamber 203, for example.

In this example, the monitoring and deposition control system 200 can include a light source 204 such as a pulsed broadband light source, including a xenon (Xe) light source aimed to radiate light into two or more UV-grade multi-mode fibers. In this example, the light source 204 is aimed into a reference fiber 206 and a substrate illumination fiber 208. The reference fiber 206 goes directly into the input slit of a spectrometer 210 such as a CCD-based, multi-channel spectrometer. The substrate illumination fiber 208 can be directed toward the deposition chamber 203, for example, where a light output 214 is collimated by a collimator 212, such as a lens or reflective system, toward the surface of a substrate 216, such as an EUVL mask blank. One instance of the substrate illumination fiber 208 is shown for illustrative purposes, but it is understood that more than one of the substrate illumination fiber 208 can be used depending on application requirements.

Reflected light 218 from the surface of the substrate 216 is collected by a collection fiber 220 which is held side-by-side, and symmetrically about the optical axis of the collimator 212. The reflected light 218 is then directed toward the input slit of the spectrometer 210, and is placed alongside, but offset with respect to the reference fiber 206. The light output 214 and the reflected light 218 are represented in this drawing by arrows with their direction indicating the direction of travel of light rays as the light bounces off of the substrate 216 in this example. As can be seen from the example drawing, the collimator 212 can act to refract the light output 214 and the reflected light 218 and change their path of travel.

It has been discovered that other fibers can be directed toward other positions on the substrate 216, thus allowing for the simultaneous monitoring of multiple locations on the substrate 216. The monitoring and deposition control system 200 can also include other systems including other fiber and CCD configurations, active and passive sensors, charge-coupled device cameras, visible light sensors, dark and bright field microscopes, x-ray reflectance systems, UV-EUV light reflectance systems, laser scattering systems, or a combination thereof. The light source 204, the substrate illumination fiber 208, the reference fiber 206, the collection fiber 220, and the spectrometer 210 can be considered as the multi-spectral reflectometry system 202 or can be called a sensor array.

For illustrative purposes, all readings have been described as from the substrate 216, but it is understood that there could be a multilayer stack composed of multiple material layers of molybdenum and silicon, for example, on the top surface of the substrate 216. The process for monitoring the surface is the same whether it is the surface of the substrate 216 or the surface of any of the material layers. The monitoring process can be continuous during deposition of the material layers on the substrate 216.

The monitoring and deposition control system 200 can first be calibrated against a reference sample, such as a piece of silicon, before the deposition of the multilayered stack ensues. For example, the light source 204 can be pulsed at regular intervals (e.g. every 100 millisecond (msec)), and for each pulse, the spectrum of the reflected light 218 is read by the spectrometer 210 and analyzed against that of the reference sample. A model based curve fitting algorithm is used to arrive at the best fit to the data in terms of the thickness of the layers being deposited within the deposition chamber 203, for example.

There are various procedures to ensure quality control of light spectrum data. For example, the procedures to ensure the validity and quality of the data include: a) ensuring that the substrate illumination fiber 208 and the reference fiber 206 receive identical light spectra from the light source 204, which can be achieved by using a mode scrambler (such as a diffuser 222), in the form of a roughened piece of quartz directly in front of the of the source; b) normalization of the spectrum of the light from the collection fiber 220 to that of the reference fiber 206 to eliminate any light level/spectrum fluctuation; and c) normalization of the spectrum of the light output 214 with respect to the wavelength-averaged light in the reflected light 218 to reduce the effect of any instability at the light re-launch stage.

For example, the monitoring process can include use of the spectrometer 210 (without application of external pulsed or chopped light from the light source 204) to take actual readings of the background level of illumination in the chamber and compensate so that background photons (from a plasma, for example) can be separated from measurement photons. After a flash from the light source 204, a signal can be recorded by the spectrometer 210. Then a signal can be taken without the flash. The no-flash signal can be subtracted from the flash signal by a processing unit connected to the spectrometer 210 in order to subtract out the background information. This method can be used to account for glow from the plasma from the source in the deposition chamber 203, for example. It has been found that this method can be used to monitor the background condition of the chamber which could be useful as another process control measurement.

Additionally, in order to increase the signal-to-noise ratio in order to improve sensitivity of the monitoring and deposition control system 200, the reference fiber 206 can be utilized. One example of how to increase the signal-to-noise ratio includes normalizing light spectra received by the spectrometer 210 to its own wavelength average. This can help minimize instability caused by achromatic shifts during delivery of the light output 214 or collection of the reflected light 218.

A second example of how to increase the signal-to-noise ratio includes normalizing the spectrum of the reflected light 218 to light received from the reference fiber 206. This should eliminate any light level/spectrum fluctuation originating from the light source 204 itself. For example, the function of the reference fiber 206 is to track and compensate for any fluctuations shot to shot of the light source 204 (such as a pulsed xenon flash lamp source light) and to remove such fluctuations from the data.

It has been discovered that if both of the above examples are used to increase the signal-to-noise ratio, the monitoring and deposition control system 200 can achieve, in situ, a better than 0.1 Å (angstrom), three sigma (within three standard deviations) thickness sensitivity with less than one second of scanning. Only a few pulses of the light source 204 are required to achieve this high level of sensitivity, and it has been found that as of the writing of this document, no other system exists which can reach this level of sensitivity in under one second of interrogation or scanning.

Further, embodiments of the monitoring and deposition control system 200 include measuring more than one location on the surface at once at any given time, or simultaneously. Further, the monitoring and deposition control system 200 can measure one location first, and then move to a different location. Alternatively, multiple fibers can be positioned to measure multiple locations on the substrate 216 at the same time. For example, the center location of the substrate 216 can be measured in parallel with perimeter locations near the edges of the substrate 216.

It has been found that since the substrate 216 or mask can be mounted on a rotating chuck during film deposition, one or more measurement points at one or more fixed radial distances can measure thickness and other film or mask properties points on one or more azimuthal arcs around the substrate 216 or mask. Further, it has been found that measuring thickness at multiple points across the substrate 216 provides a measurement of uniformity of the substrate 216. Uniformity is a thickness measurement of the material as a function of distance across the substrate 216.

It has been discovered that the monitoring and deposition control system 200 can use the reflectance spectrum of the reflected light 218 as read by the spectrometer 210 to detect very small changes in thickness of a Mo/Si multilayer stack on the substrate 216. For example, the reflectance spectrum of the reflected light 218 can be read carefully enough to determine an error as low or lower than 0.1 Å. The monitoring and deposition control system 200 can utilize wavelengths ranging from UV into IR (roughly 200 nm to 800 nm), for example.

For example, the ratio between a first spectrum (minuend) and a second spectrum (subtrahend) can be calculated to detect a change in the reflectance spectrum of the reflected light 218. It has been discovered that this reflectance spectrum ratio can definitively detect an error as low or lower than 0.1 Å. It has also been discovered that this allows the detection problem to be reduced to one of ensuring that a) there is enough light available to overcome the shot-noise from the light source 204; b) the light source 204 instabilities (variations in the light output 214 from the light source 204 are eliminated); and c) the vibration and other system related variations are accounted for.

Figure 3:
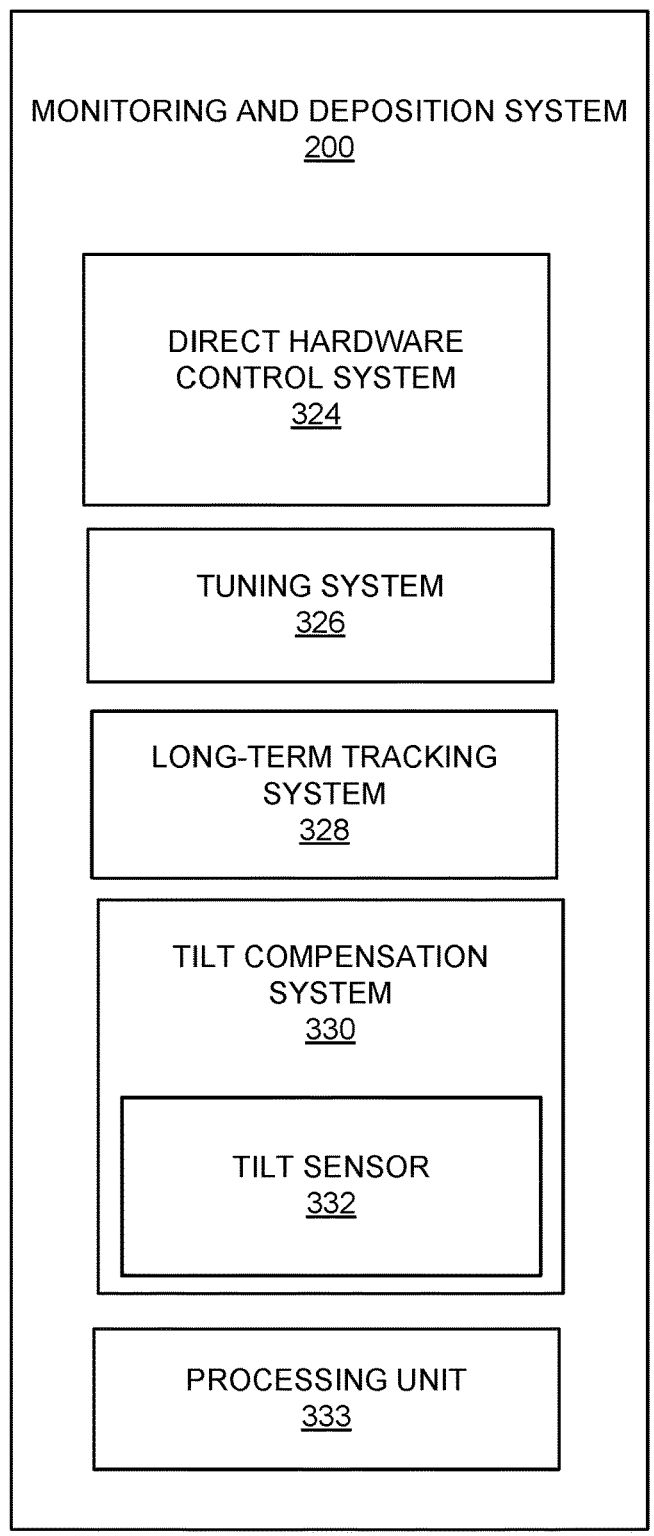
FIG. 3 is an example block diagram of some of the sub-systems included within the monitoring and deposition system of FIG. 2.

Referring now to FIG. 3, therein is shown an example block diagram of some of the sub-systems included within the monitoring and deposition system 200 of FIG. 2. The monitoring and deposition system 200 can include a hardware connection or a direct hardware control system 324 between the reflectometer signal processing and the power supply for within the deposition chamber 203 of FIG. 2. Instead of going through a software control system and the latencies involved therein, the direct hardware control system 324 would have direct control over the power supply of the deposition chamber 203.

For example, latencies of milliseconds are significant in the deposition process. The direct hardware control system 324 can include controls that include the ability to detect the end of a deposited layer or detect the imminent end of the deposited layer, and shut the power supply off directly through a hardware connection.

Further, to improve deposition precision, a specialized power supply could take input directly from a computer in the form of the direct hardware control system 324 such as a digital trigger, for example. For example, the computer could do a direct cut, such as using a DSP chip that does the spectral computation after receiving the reflected light 218 of FIG. 2 at the spectrometer 210 of FIG. 2 which then also triggers the power supply of the deposition chamber 203. This method can shorten latency delays between taking the spectral information and acting on it to produce a result on the wafer or substrate.

Traditional computing systems with an operating system produce variability in the hundreds of milliseconds. For example, the direct hardware control system 324 of the embodiments of the disclosure can include a real-time or a pseudo real-time operating system for reducing latency to tens of milliseconds. Further, the embodiment with the direct hardware control system 324 can reduce latency to a sub-millisecond level. For example, it has been discovered that the direct hardware control system 324 can be a direct power shut off system which can reduce latency of the time between the end of a deposited layer and power shut off to nanoseconds, which is a faster response than what is needed for precision of the deposition process.

Further, the monitoring and deposition system 200 can include a tuning system 326 for tuning the deposition rate at the beginning of deposition onto the substrate 216 of FIG. 2. Instead of trying to control the thickness of every layer, it has been found that the tuning system 326 can deposit a layer at the beginning of deposition which can be used as a test layer or dummy layer for use in calibration or tuning of the deposition process.

For example, the measurement of the thickness of each of the one or more test layers can be performed by the tuning system 326 for determining if the deposition rate is too fast or too slow. The dummy or test layer can allow for adjustments of the deposition rate. Further depositions of additional dummy layers can confirm if the correct deposition rate for the thickness is calibrated or tuned to the proper levels for the specific deposition machine or the deposition chamber 203, such as the first physical vapor deposition system 120 of FIG. 1, the second physical vapor deposition system 122 of FIG. 1, or the flowable chemical vapor deposition system 128 of FIG. 1, for example.

The test layers can be produced for individual Mo layers and Si layers. For example, the first Mo layer can be deposited and monitored for thickness. Then a first Si layer can be deposited and monitored for thickness. Another pair of the test layers can be deposited and confirmed to be accurate before deposition of the remaining layers. If the test layers are off (incorrect thickness), the deposition machine or chamber can be tuned to increase accuracy.

The tuning system 326 can also make use of a test layer or a reference sample embedded in the chuck that the substrate 216 is on. For example, this reference sample can be silicon or a thermal oxide having a known spectral response, and the readings from this reference sample can be used to calibrate the spectrometer 210 so as to periodically correct for any spectral distortions originating in the light delivery and collection path. For example, the reference sample can be embedded so as to be coplanar with the surface of the chuck, or the chuck can be made entirely from or coated with the material used as the reference sample. Also for example, a separate reference sample with the same height and form factor as the completed EUV mask can be used to compensate for differences in height between an embedded reference sample and the actual EUV mask multilayer stack.

It has been discovered that this reference sample on or embedded in the chuck can allow for quick and easy calibration of the spectrometer 210 prior to film deposition. Because the reference sample has a known spectral response, any distortions within the path of the light can be corrected for as necessary. The expected spectral response can be easily subtracted from the received light spectrum to obtain a picture of the distortion which would then need to be subtracted from a reading based off of a deposited surface.

The tuning system 326 can also be used to separate out changes in the refractive index (N) and absorptance (K) of a deposited layer on the surface of the substrate 216 from actual critical changes in thickness. For example, separate measurements of optical transmission can be performed by a covered photodetector in or under the chuck. If the photodetector is under the chuck, and aperture within the chuck can allow light to pass through the sample to the photodetector. Proper design of the aperture or apertures can allow continuous measurement as the chuck, the substrate 216, and the deposited layer(s) rotates.

Also for example, the photodetector can be embedded in the chuck itself. In either case, the photodetector data can be transmitted wirelessly or through some kind of rotating coupling connected to the chuck itself. As another example, additional measurements can be taken at different wavelengths in order to help distinguish changes in the refractive index and the absorptance from changes in thickness. While optical properties (refractive index and absorptance, for example) of an EUV mask blank are most critical at EUV wavelengths, it beneficial to accurately measure optical properties at other wavelengths to detect changes in material properties that might affect EUV optical properties, e.g. as an inexpensive proxy for a measurement at EUV wavelengths that require bulky, inefficient and very expensive light sources. Measurements at other wavelengths could also serve as an indication of changes in film composition that can affect film properties like layer adhesion, and to distinguish changes in film thickness from changes in refractive index, i.e. to separate change in film thickness from a change in optical path caused by a change in the refractive index of the deposited film.

It has been found to be beneficial to combine measured reflectance from one or more additional broadband or coherent light sources in addition to the light source 204, for example, to improve the accuracy of a measurement of optical properties. One or more intense, coherent sources can be used to improve measurement accuracy at certain key wavelengths, for example. The spectrometer 210, for example, can be used to detect spectral reflectance from the other light sources from the wafer or a different detector could be used.

It has been discovered that taking additional measurements at different wavelengths can separate innocuous changes in the properties of the deposited layers from critical changes in the thickness of the layers. For example, depending on the application, it may not be important that the refractive index of one of the deposited layers changes, and therefore such a change can be detected and safely ignored whereas a change in thickness can cause an alert and force the deposition process to halt. This process thus allows material savings while also avoiding the necessity of any sacrifice in quality control.

Within the monitoring and deposition system 200 is a long-term tracking system 328. The long-term tracking system 328 can implement another technique which is to measure and track the end points of each of the deposited layers and also measure thickness and accuracy readings from multiple substrates for providing information from averages over multiple substrates. This means that a layer thickness of a given layer on the substrate 216 can be tracked across multiple EUVL masks as they are manufactured. For example, monitored readings from a sample of the deposition sessions of the substrate 216 across 10 sessions can determine that the deposition for layer number 36 in each substrate is too thin.

It has been found that the long-term tracking system 328 can identify systematic errors in the deposition process and the deposition process can then be tuned to adjust the deposition rate for layer in question to compensate for any systematic drift or problems. The advantage of using the long-term tracking system 328 is that more data is used to make the determination of how to tune the deposition process to compensate for drift over time. Thus, the data gained from tracking multiple deposition sessions allows for the initial tuning of the deposition rate of the monitoring and deposition system 200, which can compensate for errors introduced by the passage of time on machine containing the monitoring and deposition system 200 and can compensate for other variability in the process. Further, the tracked data can be used to compensate for systematic drift that occurs to each layer during a sequence of deposition on the substrate 216 through many deposition sessions.

It has also been found that in-situ monitoring of the deposition process with the long-term tracking system 328 of the monitoring and deposition system 200 provides a history of the performance characteristics of an individual deposition chamber, such as the deposition chamber 203, for example. Performance can be measured when the deposition chamber 203 is clean and also measured after the chamber has been used after multiple sessions over time. In-situ monitoring can also account for changes in the condition of the chamber such as quality of cleaning and replacement parts. Without identical starting conditions, the deposition process is prone to some level of drift from substrate to substrate that can be monitored by the long-term tracking system 328.

Further, it has been found that the monitoring and deposition system 200 can include a tilt compensation system 330 that allows for compensation for tilt of the substrate 216 on the rotating chuck. The tilt compensation system 330 includes a tilt sensor 332. The tilt sensor 332 can measure at a single point on the substrate 216 and provide information on a circular track, for example.

If the substrate 216 is not level (for example, not horizontal or tilted relative to a horizontal position), the data readings from the tilt sensor 332 will show variability due to the tilt of the substrate 216, which can lead to errors in the thickness of any deposited layer. Monitoring the substrate 216 for tilt allows for the tilt compensation system 330 to compensate for any errors that occur with the thickness of the deposited layer. The tilt compensation system 330 can include a mechanism for adjusting the tilt of the rotating chuck and for minimizing wobble of the substrate 216. As a further example, the tilt compensation system 330 can also be used to compensate for any wobble by introducing a compensating wobble somewhere else in the monitoring and deposition system 200. As another example, the tilt sensor 332 can be used by the tilt compensation system 330 to determine when the tilt-angle of the rotating chuck has reached a point where compensation is insufficient and service on the rotating chuck is required. The tilt compensation system 330 can then signal a stop to the deposition process in order for service to be performed.

The monitoring and deposition system 200 can also include a processing unit 333. The processing unit 333 can operate in conjunction with any or all of the other subsystems within the monitoring and deposition system 200. The processing unit 333 can receive a determination of a change in thickness or an error which is out of specification and can adjust the deposition parameters as necessary to correct the detected error or change in thickness. The processing unit 333 can also detect a fatal error and can signal for the current substrate with a defective material layer to be removed from the deposition chamber 203, for example.

Figure 4:
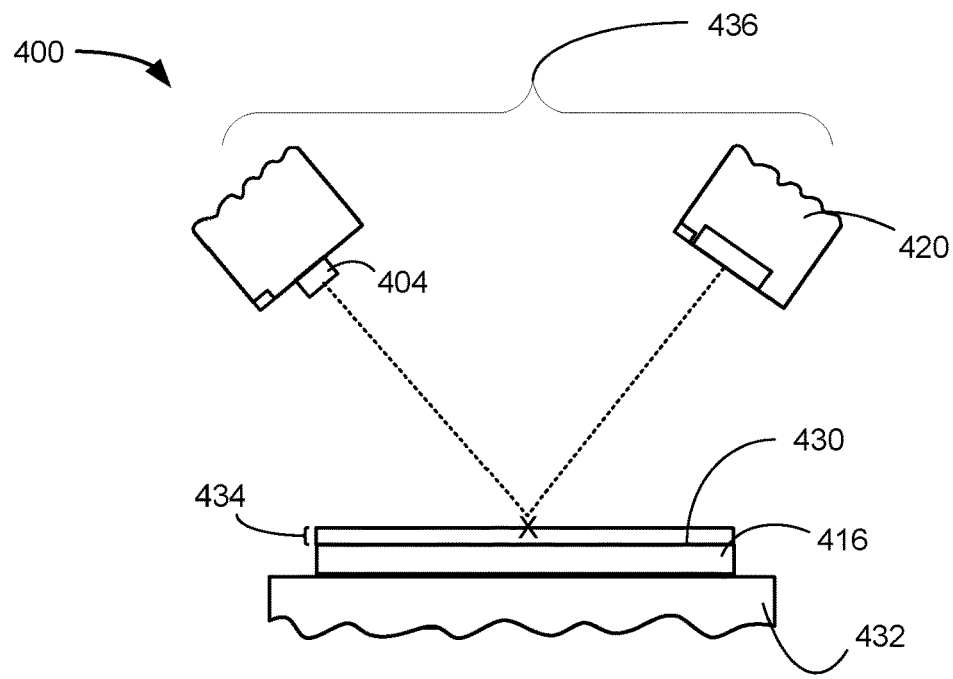
FIG. 4 is an example view of the monitoring and deposition system in accordance with a second embodiment of the present invention.

Referring now to FIG. 4, therein is shown an example view of the monitoring and deposition system 400 in accordance with a second embodiment of the present invention. This example view can include a material layer 430 from an application or deposition process. The monitoring and deposition system 400 can operate in situ.

The material layer 430 can include a film or material deposited on a substrate 416 and above a chuck 432. For example, the material layer 430 can include a planarization layer, molybdenum (Mo), silicon (Si), or other material used in the creation of an EUVL mask. The first (bottom) layer can be deposited directly on the substrate top surface of the substrate 416.

The material layer 430 can have a layer top surface and a layer thickness 434. The layer top surface is the top surface of the uppermost example of the material layer 430 that is deposited on the substrate 416. For example, the layer top surface can be the top surface of a first layer deposited on the substrate 416.

As another example, if the ninetieth layer of the multi-layer stack on the substrate 416 is the uppermost layer, it is understood that the layer top surface can also include the top surface of the ninetieth material layer. The layer thickness 434 is the thickness of the material layer 430 as measured vertically. For example, the layer thickness 434 of the material layer 430 made of silicon on the substrate 416 can be 3-4 nm thick.

The monitoring and deposition system 400 can include a sensor array 436 or sensor assembly oriented at a forty-five degree angle to the layer top surface and the substrate top surface, for example. In this example, the sensor array 436 can include a light source 404 positioned on a left side of a deposition chamber (such as the first physical vapor deposition system 120 of FIG. 1, the second physical vapor deposition system 122 of FIG. 1, or the flowable chemical vapor deposition system 128 of FIG. 1, for example) and a spectrometer 420 or detector positioned on the right side of the deposition chamber. The example view shows radiation, or light, represented by dotted lines, reflected off the layer top surface at a forty-five degree angle and received at the spectrometer 420. The "X" on the layer top surface represents the point of interest being analyzed by the sensor array 436. It is possible to move the chuck 432, the sensor array 436, or both, in order to fully analyze the material layer 430.

It has been discovered that the sensor array 436 can operate as a spectrophotometer or a reflectometer and can monitor and control excursion of the optical properties of multiple layers within the multilayer stack. The sensor array 436 can monitor diffraction interference effects within the multilayer stack many of the material layer 430 through techniques such as determining locations of Bragg peaks as an overall measure of optical quality. It is also been discovered that reflectometer measurements must be applied carefully in order to flag specific process control problems since not all measurements done using the sensor array 436 will be done at EUV wavelengths. It has been found that EUV blank optical quality is best measured at EUV wavelengths of interest.

Figure 5:
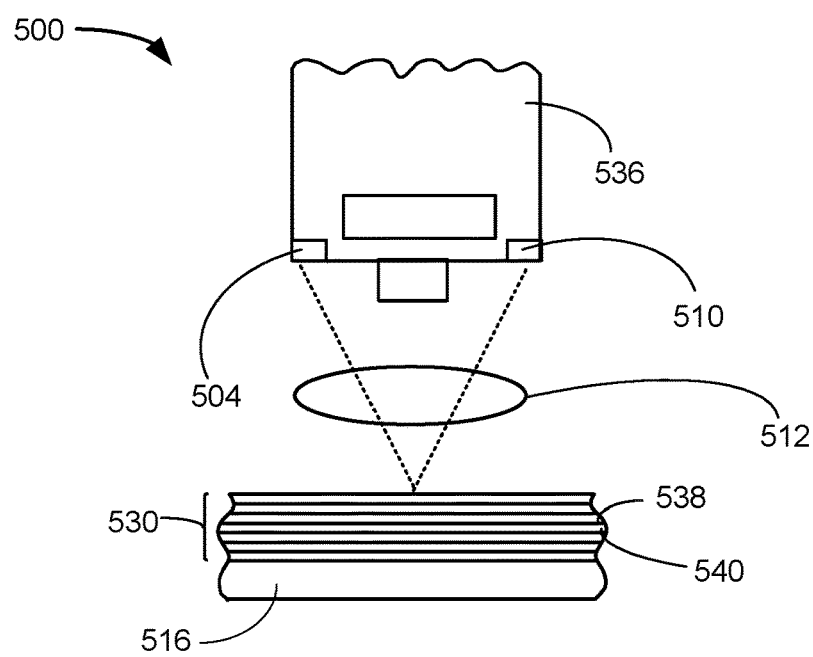
FIG. 5 is an example view of the monitoring and deposition system in accordance with a third embodiment of the present invention.

Referring now to FIG. 5, therein is shown an example view of the monitoring and deposition system 500 in accordance with a third embodiment of the present invention. The example view can show a multilayer stack 530 deposited on a substrate 516. The example view can include the substrate 516, the multilayer stack 530 (containing many of the material layer 430 of FIG. 4, for example), the layer top surface of the multilayer stack 530, a silicon layer 538, and a molybdenum layer 540. It is understood that within the multilayer stack 530 there can be many layers of silicon and molybdenum, but that two of the layers are labeled for illustrative purposes. Each layer within the multilayer stack 530 can be an example of the material layer 430.

This example view can include a light source 504 and a spectrometer 510 housed within a single assembly (a sensor array 536) rather than being mounted separately as in FIG. 4. A collimator 512 can be between the substrate 516 and the sensor array 536. The light source 504 and the spectrometer 510 can be oriented within the sensor array 536 to reflect and receive radiation at a forty-five degree angle off the layer top surface or any angle necessary to obtain as much information as possible. In this example, the light source 504 is aimed through the collimator 512.

Figure 6:
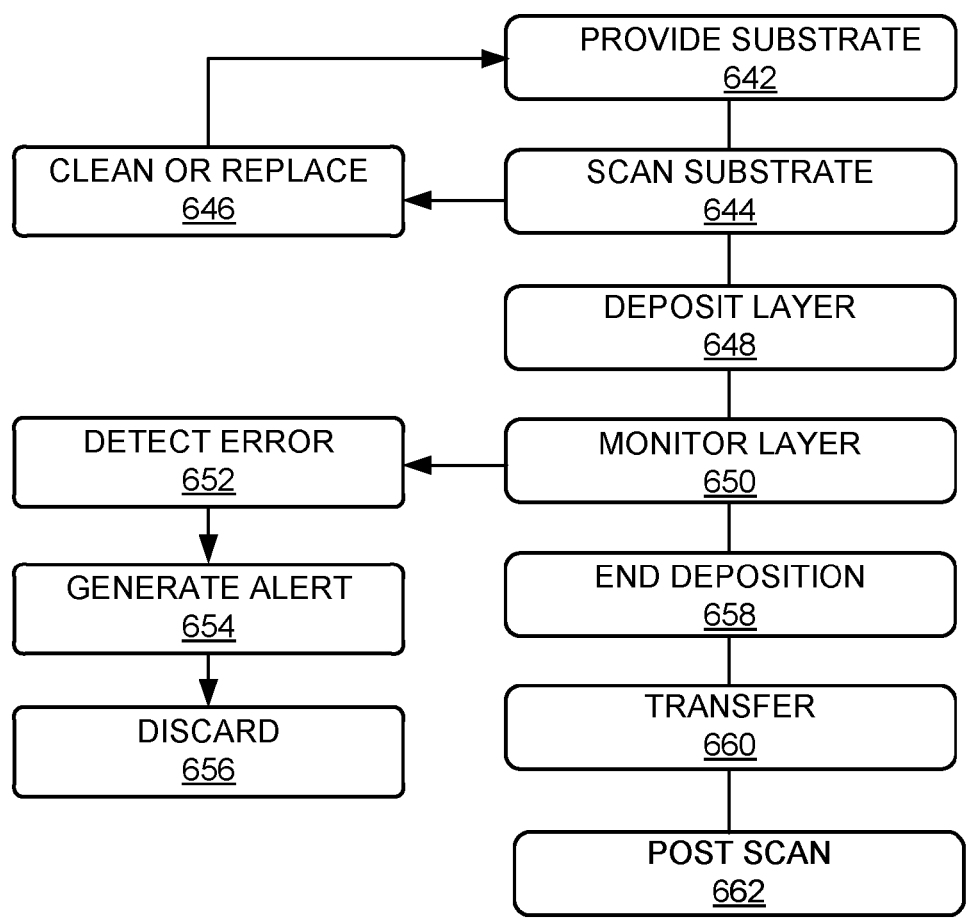
FIG. 6 is an example of a method of operation of the monitoring and deposition system in a further embodiment of the present invention.

Referring now to FIG. 6, therein is shown an example of a method 600 of operation of the monitoring and deposition system 200, 400, or 500 in a further embodiment of the present invention. The method 600 of operation can include providing a substrate in a block 642. The substrate can be placed on the chuck 432 of FIG. 4, such as a rotating electrostatic chuck.

The substrate can be scanned with the sensor array 436 or assembly of FIG. 4 in a block 644, for example. The scan can include any active, passive, or reflectance systems for detecting thickness issues, defects, and particles, such as gouges, groves, scratches, bundles, deformities, stones, boulders, and pits on the top surface of the substrate. For example, the sensor array 436 or assembly can include the light source 404 of FIG. 4 such as a Xe lamp source. If any defects are detected, the substrate can be cleaned or replaced in a block 646. The process can return to the start for a restart using a defect free substrate if cleaning or replacement was required.

After scanning for a defect free substrate, a material layer, such as the material layer 430 of FIG. 4, can be formed or applied over the substrate in a deposition process in a block 648. The deposition of the material layer can include CVD, PLD, ALD, and FCVD methods to deposit the material layer over the substrate. In the various embodiments, the material layer can contain silicon or molybdenum, for example. Also for example, the Si and Mo layers can be alternating within the multilayer stack composed of many material layers.

The multilayer stack can be monitored during the deposition process in a block 650. The monitoring during the block 650 can include a continuous scan or a scan after completion of each or all of the deposited layers using the light source 204 of FIG. 2, the collimator 212 of FIG. 2, and the spectrometer 210 of FIG. 2, for example. The monitoring can also be done using the sensor array 436, for example. The monitoring of the multilayer stack can be continuous during the entire deposition process. A continuous scan or a layer-by-layer scan of the multilayer stack can produce a spectral signature for each material layer. It has been found that the spectral signature for each material layer can be recorded for analysis.

As an example, film deposition rates can be tuned prior to full deposition through feedback from one or more dummy test films deposited prior to depositing the full stack of layers in the multilayer stack. After the deposition of the test films or test layers, these layers can be scanned to determine whether the deposition is proceeding as expected, for example. As another example, the substrate can be rotated on the rotating electrostatic chuck to provide spatial averaging of a thickness results over the substrate during a scan. Results from such a scan can allow for adjustments to the deposition process in order to optimize uniformity of film deposition.

It is been discovered that the continuous scanning of the multilayer stack during deposition allows for real-time optimization of thickness for each of the layers. Due to natural variations in and during deposition, regular process optimization is very useful to ensure that layer thicknesses remain within acceptable parameters. For example, thickness optimization can be performed within a layer (endpoint each layer deposition based on thickness feedback during deposition), from layer to layer (use results from one layer to optimize the process for depositing the next layer), or from stack to stack (use results from one stack to optimize the deposition process for the next stack).

As one example, the multilayer stack can be scanned and monitored after completion of each layer. For example, the top surface of the multilayer stack can be scanned after completion of a silicon layer, a molybdenum layer, or a Mo/Si pair. After deposition of another of the material layer, the layer top surface can be scanned depending of the number of layers deposited on the substrate.

During monitoring of the material layer during deposition, an error can be detected in a block 652. The error is defined as defect in the material layer, such as a thickness layer that is out of specification (too thin or too thick, for example). The error can be the result of an out of specification condition in the thickness uniformity, surface roughness, interface roughness, composition, or any particles found during the deposition process of an individual layer, for example.

An alert based on the error of the material layer can be generated in a block 654. The alert can include a report with spectral signature information of the material layer which produced the error when scanned.

The defective substrate (this includes defects in any one of the layers within the multilayer stack) or mask blank sample can be discarded in a block 656. It has been found that layer-by-layer monitoring provided by the monitoring system increases yield of defect free EUVL masks by reducing the amount of time and materials wasted on a defective sample. For example, a defectively deposited material layer on a substrate or mask blank sample can be discarded at the time of deposition error of an individual layer instead of after completion of the entire mask. This provides cost savings from less wasted material and less wasted time.

If the monitoring process does not detect any defects or errors during deposition, the deposition process can end in a block 658. The sample after the completed deposition process can be transferred into another chamber for further deposition or manufacturing steps in a block 660. The EUVL mask sample also can be transferred into the inspection chamber 111 of FIG. 1 for a post completion scan in a block 662.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with specific embodiments, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A monitoring and deposition control system comprising:
    a deposition chamber designed to deposit a stack of material layers on a substrate;
    a sensor array designed to continuously monitor deposition of each material layer for changes in a layer thickness of each material layer during deposition; and
    a processing unit designed to receive a determination of a change in thickness and adjust deposition parameters based on the changes in the layer thickness of each material layer during deposition.

2. The system as claimed in claim 1, wherein:
    the sensor array is designed to detect an error in each material layer; and
    the processing unit is designed to generate an alert based on the error in each material layer.

3. The system as claimed in claim 1, wherein the sensor array includes:
    a light source that generates a light output aimed at each material layer; and
    a spectrometer designed to collect the light output as reflected light off of each material layer and the processing unit determines a spectrum of the reflected light to determine properties of each material layer.

4. The system as claimed in claim 1, wherein the sensor array includes:
    a light source designed to generate a light output aimed at each material layer;
    a spectrometer designed to collect the light output as reflected light off of each material layer and the processing unit determines a spectrum of the reflected light for determining properties of each material layer; and
    wherein the processing unit is designed to normalize the spectrum of the reflected light to a wavelength average of the spectrum of the reflected light.

5. The system as claimed in claim 1, wherein the sensor array includes:
    a reference fiber;
    a light source to generate a light output aimed at each material layer and the reference fiber;
    a spectrometer to collect the light output from the reference fiber and as reflected light off of each material layer, wherein the processing unit is designed to determine a spectrum of the reflected light and the light output from the reference fiber and normalize the spectrum of the reflected light to the light output from the reference fiber and to a wavelength average of the spectrum of the reflected light.

6. The system as claimed in claim 1, further comprising:
a chuck within the deposition chamber to position the substrate; and
a reference sample having a known spectral response on the chuck used to calibrate the sensor array before depositing the stack of material layers.

7. The system as claimed in claim 4, further comprising:
a chuck within the deposition chamber to position the substrate;
a tilt compensation system having a tilt sensor designed to determine the substrate and each material layer are tilted relative to a horizontal position; and
wherein the tilt compensation system is designed to adjust the tilt of the substrate and each material layer using a mechanism in the chuck.

8. The system as claimed in claim 5, wherein the monitoring and deposition control system are designed to use the spectrum of the reflected light as collected by the spectrometer to determine a layer thickness error lower than 0.1 Angstroms.

9. The system as claimed in claim 5, wherein the monitoring and deposition control system utilizes wavelengths ranging from 200 nm to 800 nm.

10. The system as claimed in claim 9, wherein the monitoring and deposition system is designed to perform a layer-by-layer scan of the stack of material layers and record a spectral signature for each material layer.

11. The system as claimed in claim 10, wherein the monitoring and deposition system is designed to detect a layer thickness error in alternating material layers of Mo and Si.

12. They system as claimed in claim 11, wherein the monitoring and deposition control system are designed to use the spectrum of the reflected light as collected by the spectrometer to determine a layer thickness error lower than 0.1 Angstroms.

* * * * *